(12) United States Patent
Ji (10) Patent No.: US 11,886,292 B2
(45) Date of Patent: *Jan. 30, 2024

(54) MEMORY SYSTEM (71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 8 days.

This patent is subject to a terminal disclaimer.

(21) Appl. No.: 17/627,013

(22) PCT Filed: Aug. 16, 2021

(86) PCT No.: PCT/CN2021/112699
§ 371 (c)(1),
(2) Date: Jan. 13, 2022

(87) PCT Pub. No.: WO2022/151730
PCT Pub. Date: Jul. 21, 2022

(65) Prior Publication Data
US 2022/0365844 A1 Nov. 17, 2022

(30) Foreign Application Priority Data
Jan. 14, 2021 (CN) .......................... 202110050737.4

(51) Int. Cl.
H03M 13/27 (2006.01)
H04L 27/34 (2006.01)
(Continued)

(52) U.S. Cl.
CPC ...... *G06F 11/1068* (2013.01); *G06F 11/1048* (2013.01); *H03K 19/20* (2013.01)

(58) Field of Classification Search
CPC .. H03K 19/20; G06F 11/1048; G06F 11/1068
See application file for complete search history.

(56) References Cited

U.S. PATENT DOCUMENTS

| 4,736,376 A | 4/1988 | Stiffler |
| 4,749,886 A | 6/1988 | Hedayati |

(Continued)

FOREIGN PATENT DOCUMENTS

| CN | 1242088 A | 1/2000 |
| CN | 1881477 A | 12/2006 |

(Continued)

OTHER PUBLICATIONS

International Search Report cited in PCT/CN2021/112699 dated Oct. 26, 2021, 4 pages.

(Continued)

*Primary Examiner* — Guy J Lamarre
(74) *Attorney, Agent, or Firm* — Cooper Legal Group, LLC (57) ABSTRACT Provided is a memory system, which includes: a memory, configured to, during a read or write operation, write or read multiple data, the multiple data are divided into M bytes, each having N data; and an encoding module, configured to generate, at an encoding stage, X first check codes, each based on a subset of the data at fixed bits among all the bytes, and to generate, at the encoding stage, Y second check codes based on all data in a subset of the bytes, the X first check codes are configured for at least one of error detection or error correction on the N data in each of the bytes, and the Y second check codes are configured for at least one of error detection or error correction on the M bytes.

20 Claims, 5 Drawing Sheets (51) Int. Cl.
  *H04L 1/00*   (2006.01)
  *H03M 13/25*  (2006.01)
  *G06F 11/10*  (2006.01)
  *H03K 19/20*  (2006.01)

(56) References Cited

U.S. PATENT DOCUMENTS

| | | | |
|---|---|---|---|
| 5,859,858 | A | 1/1999 | Leeman |
| 5,936,870 | A | 8/1999 | Im |
| 6,891,690 | B2 | 5/2005 | Asano |
| 7,242,219 | B1 | 7/2007 | Mahurin |
| 7,653,862 | B2 | 1/2010 | Hassner |
| 8,225,175 | B2 | 7/2012 | Chen |
| 8,560,916 | B2 | 10/2013 | Yang |
| 8,862,963 | B2 | 10/2014 | Nakanishi |
| 9,411,686 | B2 | 8/2016 | Yang et al. |
| 9,754,684 | B2 | 9/2017 | Hu et al. |
| 9,985,655 | B2 | 5/2018 | Jeganathan et al. |
| 9,985,656 | B2 | 5/2018 | Jeganathan et al. |
| 11,239,944 | B1 | 2/2022 | Pan |
| 11,599,417 | B2 * | 3/2023 | Ji .................. G06F 11/1068 |
| 2004/0095666 | A1 | 5/2004 | Asano |
| 2005/0273678 | A1 | 12/2005 | Dietrich |
| 2007/0011598 | A1 | 1/2007 | Hassner |
| 2009/0106633 | A1 | 4/2009 | Fujiwara |
| 2010/0185904 | A1 | 7/2010 | Chen |
| 2011/0191651 | A1 | 8/2011 | Chen |
| 2011/0239082 | A1 | 9/2011 | Yang |
| 2012/0311408 | A1 | 12/2012 | Nakanishi |
| 2015/0058700 | A1 | 2/2015 | Yang et al. |
| 2015/0143201 | A1 | 5/2015 | Coteus |
| 2017/0060677 | A1 | 3/2017 | Jeganathan et al. |
| 2017/0060679 | A1 | 3/2017 | Jeganathan |
| 2017/0222664 | A1 | 8/2017 | Tsuboi |
| 2017/0353271 | A1 | 12/2017 | Kudekar et al. |
| 2018/0205498 | A1 | 7/2018 | Kudekar et al. |
| 2019/0034270 | A1 | 1/2019 | Byun et al. |
| 2019/0280817 | A1 | 9/2019 | Kudekar et al. |
| 2022/0223186 | A1 * | 7/2022 | Ji ................. H03K 19/20 |
| 2022/0223221 | A1 * | 7/2022 | Ji ................. H03M 13/2906 |
| 2022/0230701 | A1 * | 7/2022 | Ji ................. G11C 29/18 |

FOREIGN PATENT DOCUMENTS

| | | |
|---|---|---|
| CN | 101183565 A | 5/2008 |
| CN | 101980339 A | 2/2011 |
| CN | 102339641 A | 2/2012 |
| CN | 102543209 A | 7/2012 |
| CN | 102810336 A | 12/2012 |
| CN | 102857217 A | 1/2013 |
| CN | 103078629 A | 5/2013 |
| CN | 104425019 A | 3/2015 |
| CN | 105471425 A | 4/2016 |
| CN | 105471425 B | 5/2018 |
| CN | 108038023 A | 5/2018 |
| CN | 109036493 A | 12/2018 |
| CN | 109308228 A | 2/2019 |
| CN | 110968450 A | 4/2020 |
| CN | 111443887 A | 7/2020 |
| JP | S61277230 A | 12/1986 |
| JP | S63102510 A | 5/1988 |
| JP | H07212222 A | 8/1995 |
| JP | 201079485 A | 4/2010 |
| JP | 2012022422 A | 2/2012 |
| JP | 2013074560 A | 4/2013 |

OTHER PUBLICATIONS

Supplementary European Search Report in the European application No. 21863077.0, dated Jun. 29, 2023, 8 pages.
First Office Action of the Japanese application No. 2022-538785, dated Aug. 22, 2023, 5 pages with English translation.
First Office Action of the Japanese application No. 2022-538713, dated Aug. 1, 2023. 8 pages with English translation.
Notice of Allowance of the U.S. Appl. No. 17/668,715, dated Jun. 16, 2023. 40 pages.
Notice of Allowance of the Japanese application No. 2022-538835, dated Aug. 8, 2023. 3 pages with English 5 translation.
First Office Action of the Korean application No. 10-2022-7021376, dataed Nov. 27, 2023, 12 pages with English translation.
Notice of Allowance of the U.S. Appl. No. 17/657,942, dated Oct. 18, 2023, 28 pages.
Non-Final Office Action of the U.S. Appl. No. 17/669,565, dated Oct. 19, 2023, 40 pages.

* cited by examiner

| Byte | 0 | | | | | | | |
|------|---|---|---|---|---|---|---|---|
| Bit | 0 | 1 | 2 | 3 | 4 | 5 | 6 | 7 |
| pc0 |   | × |   | × |   | × |   | × |
| pc1 |   |   | × | × |   |   | × | × |
| pc2 |   |   |   |   | × | × | × | × |

| Byte | 0 | 1 | 2 | 3 | 4 | 5 | 6 | 7 | 15 | 14 | 13 | 12 | 11 | 10 | 9 | 8 |
|------|---|---|---|---|---|---|---|---|----|----|----|----|----|----|---|---|
| pc3 | × |   | × | × | × | × | × |   |    |    |    |    |    |    |   | × |
| pc4 | × | × |   |   | × | × |   | × |    |    |    | ×  |    | ×  | × |   |
| pc5 |   | × | × |   | × |   | × |   |    | ×  | ×  |    | ×  |    | × |   |
| pc6 |   |   |   | × |   | × | × | × | ×  | ×  |    |    | ×  | ×  |   |   |
| pc7 |   |   |   |   |   |   |   |   | ×  |    | ×  | ×  | ×  | ×  | × | × |

MEMORY SYSTEM

CROSS-REFERENCE TO RELATED APPLICATIONS

This is a U.S. national stage application of International Application No. PCT/CN2021/112699, filed on Aug. 16, 2021, which claims priority to Chinese Patent Application No. 202110050737.4, filed on Jan. 14, 2021, the entire contents of which are incorporated herein by reference.

TECHNICAL FIELD

Embodiments of the disclosure relate to, but are not limited to, a memory system.

BACKGROUND

Semiconductor memories may be divided into non-volatile memories and volatile memories. As a volatile memory, Dynamic Random Access Memory (DRAM) has advantages of high memory density, fast read and write speed, etc., and thus is widely used in various electronic systems.

As the process of DRAM becomes more and more advanced and the memory density thereof becomes higher and higher, errors may occur when data is stored in DRAM, seriously affecting the performance of DRAM. Thus, Error Checking and Correction (ECC) or Error correction Coding (ECC) techniques are commonly used in DRAM to detect or correct errors in stored data.

SUMMARY

Embodiments of the disclosure provide a memory system including: a memory, configured to, during a read or write operation, write or read multiple data, here the multiple data are divided into M bytes, each having N data; and an encoding module, configured to generate, at an encoding stage, X first check codes, each based on a subset of the data at fixed bits among all the bytes, and to generate, at the encoding stage, Y second check codes based on all data in a subset of the bytes, here the X first check codes are configured for at least one of error detection or error correction on the N data in each of the bytes, and the Y second check codes are configured for at least one of error detection or error correction on the M bytes; here each of M, N, X and Y is a positive natural number.

BRIEF DESCRIPTION OF THE DRAWINGS

One or more embodiments are exemplified by pictures in accompanying drawings corresponding thereto, which do not constitute limitations of the embodiments. An element having the same reference numeral in the drawings is designated as a similar element, and figures in the drawings do not constitute limitations of a scale, unless stated specifically.

DETAILED DESCRIPTION

Embodiments of the disclosure provide a memory system, in which at an encoding stage, an encoding module acquires a check code(s) configured for at least one of error detection or error correction on a byte, and a check code(s) configured for at least one of error detection or error correction on different bits in the byte, respectively, thereby facilitating to simplify a hardware circuit, reduce power consumption of the memory system and increase an encoding speed while implementing an ECC technology.

In order to make the objectives, technical solutions and advantages of the embodiments of the disclosure clearer, the embodiments of the disclosure will be described in detail below with reference to the accompanying drawings. However, it may be understood by those of ordinary skill in the art that in the embodiments of the disclosure, many technical details have been proposed for a reader to better understand the disclosure. However, even without these technical details and various changes and modifications based on the following embodiments, the technical solutions claimed herein may be realized.

Figure 1:
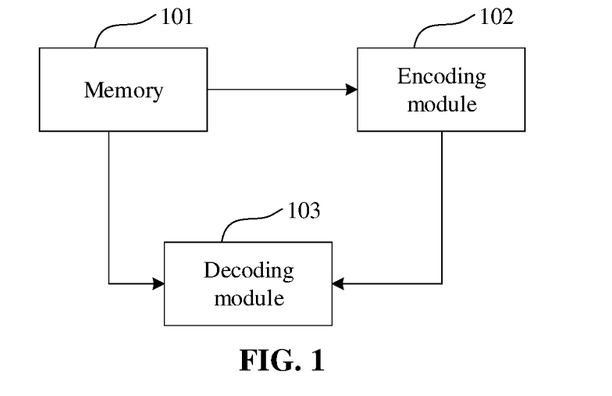
FIG. 1 is a first functional block diagram of a memory system according to an embodiment of the disclosure.

FIG. 1 is a first functional block diagram of a memory system according to an embodiment of the disclosure.

Referring to FIG. 1, in the embodiment of the disclosure, the memory system includes: a memory 101, configured to, during a read or write operation, write or read multiple data, here the multiple data are divided into M bytes, each having N data; and an encoding module 102, configured to generate, at an encoding stage, X first check codes, each based on a subset of the data at fixed bits among all the bytes, and to generate, at the encoding stage, Y second check codes based on all data in a subset of the bytes, here the X first check codes are configured for at least one of error detection or error correction on the N data in each of the bytes, and the Y second check codes are configured for at least one of error detection or error correction on the M bytes; here each of M, N, X and Y is a positive natural number.

The embodiment of the disclosure provides a new memory system in which data is partitioned into different bytes, and a first check code(s) is/are configured for at least one of error detection or error correction on N data in each of the bytes, and a second check code(s) is/are configured for at least one of error detection or error correction on M bytes. The encoding mode based on error detection and error correction may not only implement ECC, but also implement ECC by using fewer hardware circuits, which facilitates to reduce power consumption of the memory system and optimize speed and result of ECC. It should be noted that in the embodiment of the disclosure, the first check code(s) is/are configured for at least one of error detection or error correction on N data in each of the bytes, and the second check code(s) is/are configured for at least one of error detection or error correction on M bytes. It should be understood that all the first check code(s) and the second check code(s) are configured together for at least one of error detection or error correction on all data in the M bytes, the second check code(s) is/are configured to locate erroneous data to a specific one of the M bytes, and the first check code(s) is/are configured to locate erroneous data to a specific bit of the byte.

The memory system provided by the embodiment of the disclosure will be described in detail below with reference to the accompanying drawings.

In the embodiment of the disclosure, the memory 101 is a DRAM, and for example, may be Double Data Rate4 (DDR4), Low Power DDR4 (LPDDR4), DDR5, or LPDDR5. In some embodiments of the disclosure, the memory may also be other types of memories, such as non-volatile memories such as NAND, NOR, Ferroelectric Random Access Memory (FeRAM), Phase change Random Access Memory (PcRAM), and the like.

Typically, a byte is a basic unit in data processing. The information is stored and interpreted in bytes, and it is specified that one byte is composed of eight binary bits, that is, one byte is equal to eight bits, each of which has a respective bit, i.e., 1 Byte=8 bits. Based on this, in the embodiment of the disclosure, N is eight to maximize the bits in each byte, thereby facilitating to increase a utilization rate of a circuit required by a codec circuit. It may be understood that in some embodiments of the disclosure, N may also be another suitable positive integer.

For example, when the data transmitted by the memory 101 during a single read or write operation has 128 bits (i.e., 128-bit), then M is 16 and N is 8. It should be noted that in some embodiments of the disclosure, depending on the number of bits of data transmitted by the memory during the read or write operation, M may be another suitable positive integer, as long as M*N is equal to the number of bits of data transmitted during the read or write operation.

Figure 2:
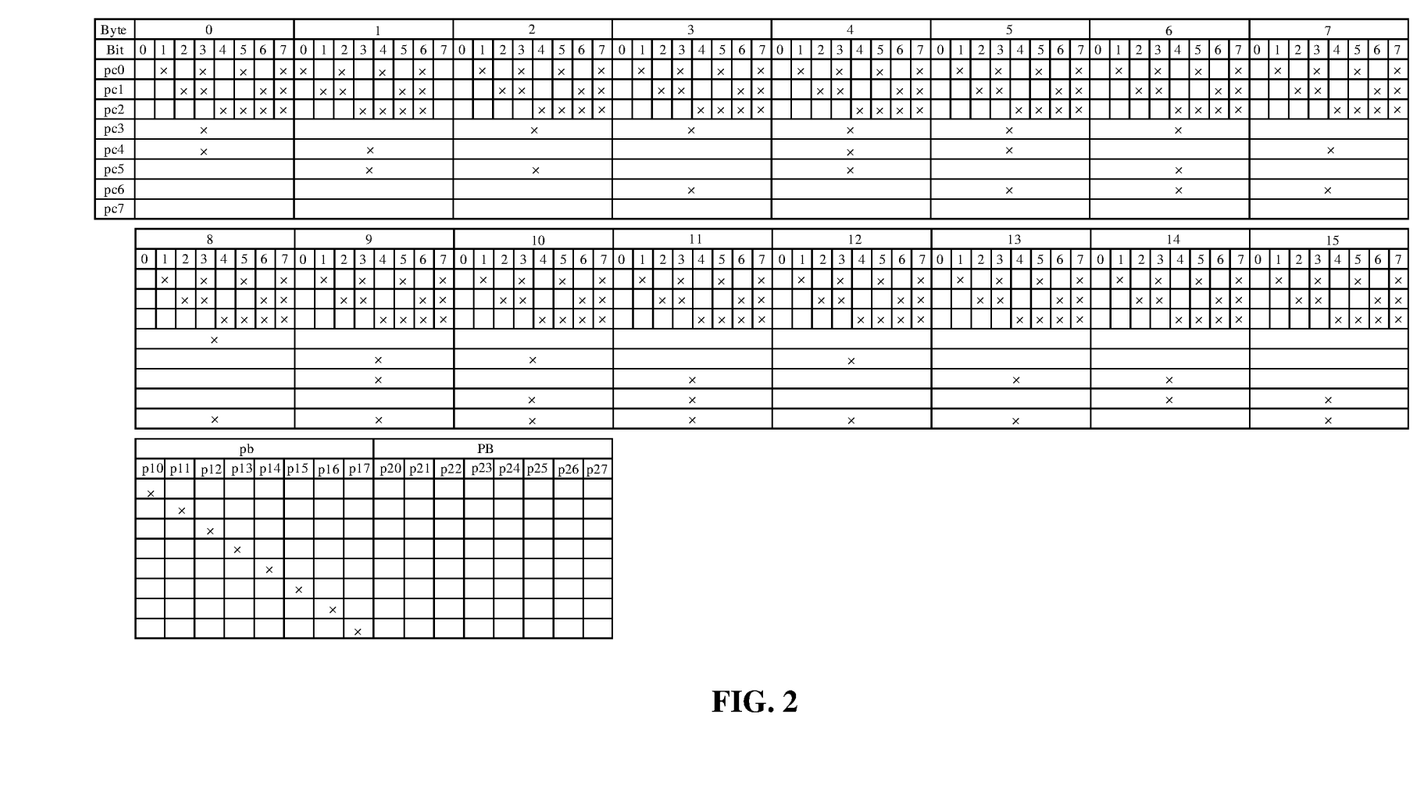
FIG. 2 is a schematic diagram of a classification of multiple data and a relationship thereof with first check codes and second check codes according to an embodiment of the disclosure.

FIG. 2 is a schematic diagram of a classification of multiple data and a relationship thereof with first check codes and second check codes according to an embodiment of the disclosure. Each of N data has a different bit. In the embodiment of the disclosure, as shown in FIG. 2, for each byte, the N data have bits from zero to seven, which are incremental by a natural number; for all the bytes, the M bytes are partitioned into sixteen bytes from zero to fifteen, which are incremental by a natural number. In addition, for each of different bytes, the N data in the byte have eight bits increasing from zero to seven.

Figure 3:
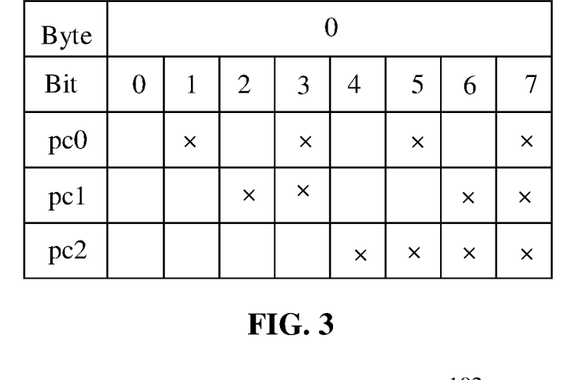
FIG. 3 is a schematic enlarged diagram illustrating first check codes corresponding to byte 0.

It should be noted that in FIG. 2, a table which is actually in the same row is split into three tables due to space limitations, which is actually a complete table. For ease of illustration, FIG. 3 is a schematic enlarged diagram illustrating first check code(s) corresponding to byte 0.

In the embodiment of the disclosure, the encoding module 102 generates a first check code(s) and a second check code(s) by using a parity check principle, and accordingly, each of the first check code(s) and the second check code(s) is a parity check code. In the embodiment of the disclosure, the memory system is a memory chip, and accordingly, the memory 101 and the encoding module 102 are integrated in the same memory chip. It should be understood that in some embodiments of the disclosure, the memory may be a memory chip, the memory system further includes a controller configured to control the memory, and the encoding module is further integrated within the controller. It should be noted that the embodiment of the disclosure does not make limitation on whether the memory and the encoding module are integrated into the same chip or arranged on different chips.

Figure 4:
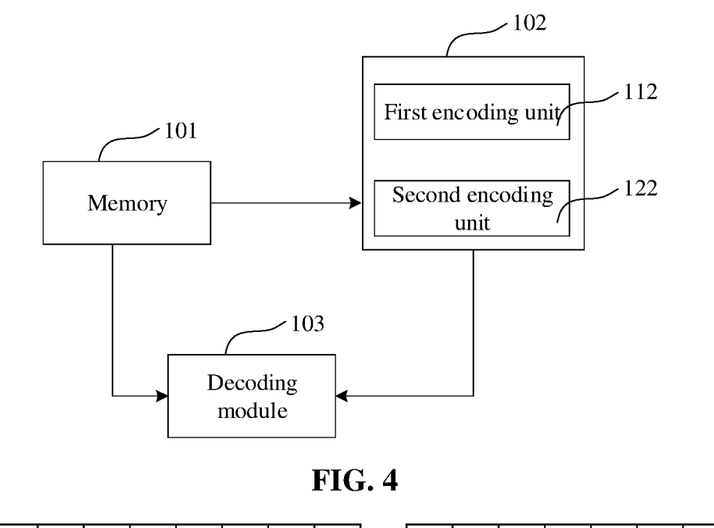
FIG. 4 is a second functional block diagram of a memory according to an embodiment of the disclosure.

FIG. 4 is a second functional block diagram of a memory according to an embodiment of the disclosure.

Referring to FIG. 4, the encoding module 102 includes a first encoding unit 112 configured to generate the X first check codes, and the X first check codes constitute an X-bit first binary number; here 2X is greater than or equal to N, each of the first check codes is obtained by performing a first encoding operation on the subset of the data in all the bytes, and the X first check codes correspond to X subsets of the data in a one-to-one manner, different subsets corresponding to different bit combinations in the bytes. That is, each of the first check codes is obtained by selecting data of multiple bits in each of the bytes to perform the first encoding operation, and the selected bit combinations in all bytes are the same for the same first check code, and the selected bit combinations in N data are different for different first check codes.

Here the N data have bits from zero to N−1, which are incremental by a natural number, and the first check codes obtained by selecting each of the bits to perform the first encoding operation are not exactly the same. In the embodiment of the disclosure, different first check codes are obtained by performing the first encoding operation based on different data in all bytes, so that the bits affecting the result of the first check code(s) are different for different first check codes. Meanwhile, since 2X is greater than or equal to N, the first check codes obtained by selecting each of the bits to perform the first encoding operation may not be exactly the same, so that the specific bit, on which erroneous data occurs may be obtained by analysis.

In the embodiment of the disclosure, X is 3, so that errors of data of different bits may be identified, and the complexity of the hardware circuit of the first encoding unit 112 may be reduced.

In some embodiments of the disclosure, the three first check codes include a first check code at the zeroth bit, a first check code at the first bit, and a first check code at the second bit in a sequence from a lowest bit to a highest bit, and the N data have bits from zero to N−1, which are incremental by a natural number, for example, the zeroth bit does not participate in the first encoding operation corresponding to any of the first check codes; the first bit participates in the first encoding operation corresponding to the first check code at the zeroth bit; the second bit participates in the first encoding operation corresponding to the first check code at the first bit; the third bit participates in the first encoding operation corresponding to the first check codes at the zeroth and first bits; the fourth bit participates in the first encoding operation corresponding to the first check code at second bit; the fifth bit participates in the first encoding operation corresponding to the first check codes at the zeroth and second bits; the sixth bit participates in the first encoding operation corresponding to the first check codes at the first and second bits; the seventh bit participates in the first encoding operation corresponding to the first check codes at the zeroth, first and second bits. It should be understood that those skilled in the art may set the number of the first check codes and other encoding operation relationships as required, as long as the first check codes obtained by selecting each of the bits to perform the first encoding operation are not exactly the same.

In the embodiment of the disclosure, the first encoding operation is an exclusive OR (XOR) operation; and accordingly, the first encoding unit 112 is configured such that in the X-bit first binary number, the first check code at a lowest bit is XOR of data at first, third, fifth and seventh bits of all the bytes, the first check code at a highest bit is XOR of data at fourth, fifth, sixth and seventh bits of all the bytes, and the first check code at an intermediate bit is XOR of data at second, third, sixth and seventh bits of all the bytes.

It should be noted that in some embodiments of the disclosure, the first encoding operation may also be a not exclusive OR (XNOR) operation; and accordingly, the first encoding unit is configured such that in the X-bit first binary number, the first check code at a lowest bit is XNOR of data at first, third, fifth and seventh bits of all the bytes, the first check code at a highest bit is XNOR of data at fourth, fifth, sixth and seventh bits of all the bytes, and the first check code at an intermediate bit is XNOR of data at second, third, sixth and seventh bits of all the bytes.

The principle of generating the first check code will be described below with reference to FIGS. 2 and 3.

As shown in FIGS. 2 and 3, "X" represents currently participating in the encoding operation in this row, i.e., XNOR or XOR; and the 128-bit data is partitioned into sixteen bytes numbered from zero to fifteen, each byte having eight bits. p10, p11 and p12 represent three first check codes; p13, p14, p15, p16 and p17 represent five second check codes; pc0 to pc7 represent eight formulas corresponding to p10 to p17 respectively when the encoding operation is performed. In each row, all positions marked by "X" represent that data corresponding to this column needs to participate in XOR or XNOR in this formula. The first check code(s) and the second check code(s) correspond to PB.

During the first encoding operation or the second encoding operation of the encoding stage, the first encoding operation or the second encoding operation is performed by using the eight formulas from pc0 to pc7, the results of the operations are stored in p10 to p17, respectively, and p10 to p17 do not participate in the first encoding operation or the second encoding operation. At the decoding phase, formulas corresponding to rows are not changed, and the stored p10 to p17 need to participate in the operation. Therefore, in the table of FIG. 2, p10 to p17 are marked by "X" correspondingly, which will be described in detailed later.

In the embodiment of the disclosure, at the encoding stage: for each byte, XOR or XNOR operation is performed on data at first, third, fifth and seventh bits of the byte, and then XOR or XNOR operation is performed on all XOR or XNOR results of sixteen bytes, which is the formula pc0, and the result of the operation is given to p10. For each byte, XOR or XNOR operation is performed on data at second, third, sixth and seventh bits of the byte, and then XOR or XNOR operation is performed on all XOR or XNOR results of sixteen bytes, which is formula pc1, and the result of the operation is given to p11. For each byte, an XOR or XNOR operation is performed on data at fourth, fifth, sixth and seventh bits of the byte, and then an XOR or XNOR operation is performed on all XOR or XNOR results of sixteen bytes, which is formula pc2, and the result of the operation is given to p12.

p10, p11, and p12 constitute a first binary number, and p10 is the lowest bit and p12 is the highest bit. In the case where only one of multiple data in the memory is erroneous, it is not difficult to find that:

When the data at the zeroth bit is erroneous, each of the first check codes p10, p11 and p12 is not affected since the zeroth bit does not participate in the formulas pc0, pc3 and pc3;

When the data at the first bit is erroneous, the first check code p10 is affected while the first check codes p11 and p12 are not affected since the first bit participates in the formula pc0 and does not participate in the formulas pc1 and pc2;

When the data at the second bit is erroneous, the first check codes p10 and p12 are not affected while the first check code p11 is affected since the second bit participates in the formula pc1;

When the data at the third bit is erroneous, the first check codes p10 and p11 are affected while the first check code p12 is not affected since the third bit participates in the formulas pc0 and pc1;

By analogy, when the data at the seventh bit is erroneous, each of the first check codes p10, p11 and p12 is affected since the seventh bit participates in the formulas pc0, pc1 and pc2.

It should be noted that a specific first check code is affected after a specific data is erroneous, it means that the specific first check code obtained by re-performing the first encoding operation after the specific data is erroneous, is different from the first check code formed before the data is erroneous.

It may be understood that for each formula, since the bits participating in the first encoding operation are the same among different bytes, it may be known at which bit an erroneous data is present by the first check code, but it cannot be detected in which byte an erroneous data is present at the corresponding bit. Therefore, it is also necessary to use the second check code to know in which byte an erroneous data is present at the corresponding bit.

Accordingly, in the embodiment of the disclosure, the encoding module 102 further includes a second encoding unit 122, configured to generate the Y second check codes, and the Y second check codes constitute a Y-bit second binary number; where 2Y is greater than or equal to M, and each of the second check codes is obtained by performing a second encoding operation on a subset of the bytes.

Since 2Y is greater than or equal to M, it can be ensured that the second check codes obtained by each of the bytes participating in the second encoding operation are not exactly the same. In the embodiment of the disclosure, different second check codes are obtained by performing the second encoding operation based on different subsets of bytes, so that for different second check codes, the bytes affecting the result of the second check code are different, to facilitate comprehensive analysis, to known the specific byte in which an erroneous data is present, to finally determine in which byte and at which bit the erroneous data is present, by considering the specific bit of the byte at which an erroneous data is present. It should be noted that the meaning of "affect" in the phrase of affecting the result of the second check code is the same as the meaning of "affect" as mentioned previously.

In the embodiment of the disclosure, Y is 5, so that erroneous data of different bytes can be indicated, and the complexity of the hardware circuit of the second encoding unit 122 can be reduced.

In the embodiment of the disclosure, the second encoding operation is XOR; the second encoding unit 122 includes: a first-stage operation unit, configured to perform the XOR operation on all data of selected two of the bytes, and store multiple first operation results, each being an XOR operation result of the selected two of the bytes; and a second-stage operation unit, configured to perform the XOR operation on at least two of the first operation results, to generate the second check code, and generate the Y second check codes based on different encoding requirements.

In some embodiments of the disclosure, the second encoding operation may also be an XNOR operation, and accordingly, the second encoding unit includes: a first-stage operation unit, configured to perform the XNOR operation on all data of selected two of the bytes, and store multiple first operation results, each being an XNOR operation result of the selected two of the bytes; and a second-stage operation unit, configured to perform the XNOR operation on at least two of the first operation results, to generate the second check code, and generate the Y second check codes based on different encoding requirements.

In the embodiment of the disclosure, by a special design of the second encoding unit 122, the second-stage operation unit may reuse the first operation result of the first-stage operation unit, so that the second encoding unit 122 may be implemented by fewer hardware circuits, thereby reducing power consumption of the memory system.

Accordingly, the first-stage operation unit includes: a first operation subunit, configured to perform an XOR or XNOR operation on all data of a same one of the bytes and store second operation results; and a second operation subunit, configured to perform an XOR or XNOR operation on two of the second operation results and acquire the first operation result.

Figure 5:
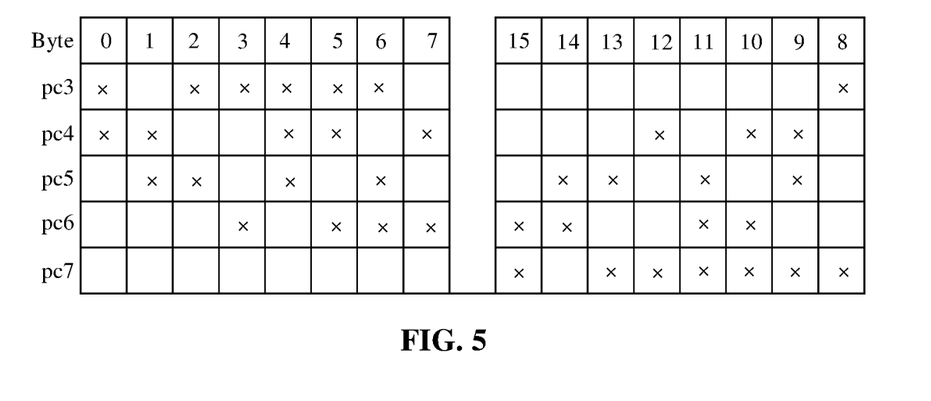
FIG. 5 is a schematic diagram illustrating a principle of performing a second encoding operation on all bytes.

In the embodiment of the disclosure, as shown in FIG. 5, for each of the bytes, an XOR operation is performed on data of all eight bits in the byte at the encoding stage, to obtain an XOR result of the byte; then, a second encoding operation is performed on sixteen XOR results of all sixteen bytes according to five formulas pc3 to pc7, that is, the data marked by "X" in a row of the table participate in the operation to obtain second check codes pc13 to pc17. It may be understood that the second check codes pc13 to pc17 do not participate in the encoding operation at the encoding stage, and the second check codes pc13 to pc17 also need to participate in the operation at the subsequent decoding stage (or referred to as the decoding stage). Therefore, the second check codes pc13 to pc17 are marked by "X" in FIG. 2, which will be explained later and will not be elaborated here.

In the embodiment of the disclosure, the M bytes are divided into zeroth to fifteenth bytes which are incremental by a natural number; the Y second check codes are divided into third to seventh second check codes which are incremental by a natural number; the acquisition of the five second check codes are as follows.

The third second check code (corresponding to p13 in FIG. 2) is an XOR or XNOR of all data of the zeroth, second, third, fourth, fifth, sixth and eighth bytes; the fourth second check code (corresponding to p14 in FIG. 2) is an XOR or XNOR of all data of the zeroth, first, fourth, fifth, seventh, ninth, tenth and twelfth bytes; the fifth second check code (corresponding to p15 in FIG. 2) is an XOR or XNOR of all data of the first, second, fourth, sixth, ninth, eleventh, thirteenth and fourteenth bytes; the sixth second check code (corresponding to p16 in FIG. 2) is an XOR or XNOR of all data of the third, fifth, sixth, seventh, tenth, eleventh, fourteenth and fifteenth bytes; the seventh second check code (corresponding to p17 in FIG. 2) is an XOR or XNOR of all data of the eighth, ninth, tenth, eleventh, twelfth, thirteenth and fifteenth bytes.

It should be noted that each of the second check codes is obtained by the XOR operation; in an embodiment, each of the second check codes is obtained by the XNOR operation.

A circuit corresponding to the second encoding unit 122 is designed to:

perform an XOR operation on XOR results of byte 0 and byte 4 to obtain a result 0_4; perform an XOR operation on results of byte 2 and byte 6 to obtain a result 2_6;

perform an XOR operation on results of byte 3 and byte 5 to obtain a result 3_5; perform an XOR operation on results of byte 1 and byte 5 to obtain a result 1_5; perform an XOR operation on results of byte 1 and byte 4 to obtain a result 1_4.

It is not difficult to find that as shown in FIG. 5, FIG. 5 is a schematic diagram illustrating a principle of performing a second encoding operation on all bytes. Compared to bytes 0 to 7, the same set of circuits may be used to complete the operation on bytes 8 to 15, that is, only the input is changed, and the same operation may be performed on bytes 8 to 15 to obtain a result 9_13, a result 10_12, a result 11_15, a result 10_14 and a result 11_14. Furthermore, in addition to these operations using the same circuit, it is necessary to perform an XOR operation on byte 6 and byte 7 to obtain a result 6_7, and perform an XOR operation on results of byte 7 and byte 9 to obtain a result 7_9.

The XOR operation is performed according to the requirement of formulas pc3 to pc7: for example, the XOR operation is performed on the result 0_4, the result 2_6, the result 3_5, and the XOR result of the byte 8 according to the formula pc3 to obtain the second check code p13; the XOR operation is performed on the result 0_4, the result 1_5, the result 7_9, and the result 10_12 according to the formula pc4 to obtain the second check code p14. The acquisition of the second check codes p15, p16 and p17 are not described one by one in detail. It may be understood that the result 0_4, the result 2_6, and the like may be reused to save circuit resources.

Furthermore, in the embodiment of the disclosure, the second encoding unit 122 may be further configured such that a number of times that each of the bytes participates in the second encoding operation is a, here a is a positive integer greater than or equal to (Y−1)/2 and less than or equal to (Y+1)/2. With this configuration, in the decoding circuit required to perform the subsequent decoding phase, the wire and area of the circuit may be reduced, and the decoding speed may be increased.

It may be found from the foregoing descriptions that both the acquisition of the first check code(s) and the acquisition of the second check code(s) are implemented by using the XOR or XNOR operation, and therefore the memory system further includes a comparison circuit configured to implement the XOR or XNOR operation.

Figure 6:
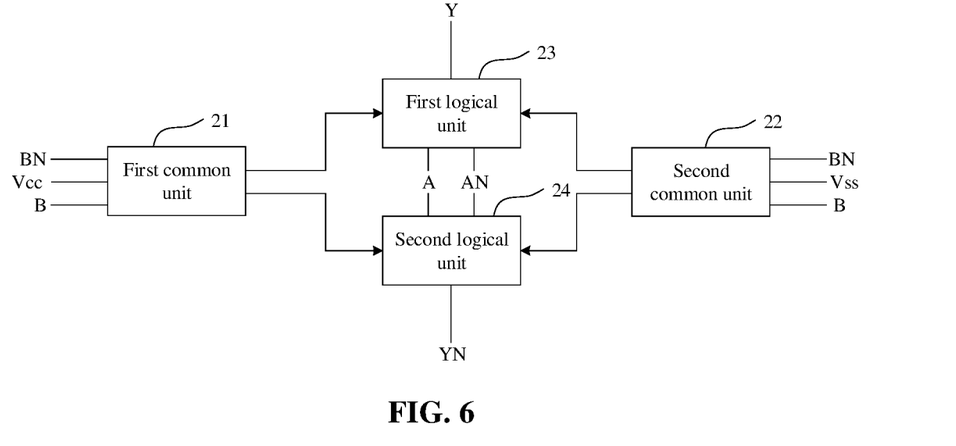
FIG. 6 is a functional block diagram of a comparison circuit in a memory system according to an embodiment of the disclosure.

FIG. 6 is a functional block diagram of a comparison circuit in a memory system according to an embodiment of the disclosure. In the embodiment of the disclosure, the encoding module 102 further includes a comparison circuit (not shown), configured to perform an XOR operation or an XNOR operation on all data of any two of the bytes, or perform the XOR or XNOR operation on the subset of the data.

Referring to FIG. 6, the comparison circuit includes: a first common unit 21, connected to a power supply signal Vcc and configured to control output of the power supply signal Vcc based on a first signal B and a second signal BN which are inverted; a second common unit 22, connected a ground signal Vss and configured to control output of the ground signal Vss based on the first signal B and the second signal BN; a first logical unit 23, connected between the first common unit 21 and the second common unit 22, and configured to receive a third signal A and a fourth signal AN which are inverted, and output a first operation signal Y which is an XOR of the first signal B and the third signal A;

and a second logical unit 24, connected between the first common unit 21 and the second common unit 22, and configured to receive the third signal A and the fourth signal AN, and output a second operation signal YN which is an XNOR of the first signal B and the third signal A.

Figure 7:
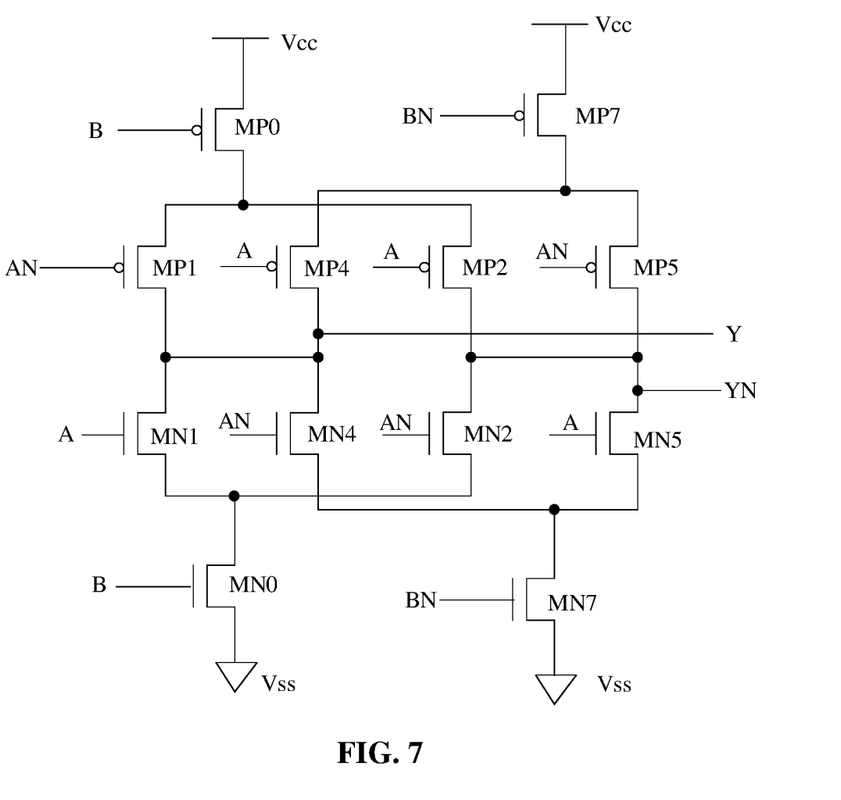
FIG. 7 is a schematic structural diagram of a comparison circuit.

FIG. 7 is a schematic structural diagram of a comparison circuit.

In the embodiment of the disclosure, referring to FIG. 7, the first common unit 21 includes: a zeroth P-channel Metal Oxide Semiconductor (PMOS) transistor MP0, having a gate for receiving the first signal B and a source connected to the power supply signal Vcc; and a seventh PMOS transistor MP7, having a gate for receiving the second signal BN and a source connected to the power supply signal Vcc. When the first signal B is at a high level and the second signal BN is at a low level, the zeroth PMOS transistor MP0 is turned off and the seventh PMOS transistor MP7 is turned on; and when the first signal B is at a low level and the second signal BN is at a high level, the zeroth PMOS transistor MP0 is turned on and the seventh PMOS transistor MP7 is turned off.

The second common unit includes: a zeroth N-channel Metal Oxide Semiconductor (NMOS) transistor MN0, having a gate for receiving the first signal B and a source connected to the ground signal Vss; and a seventh NMOS transistor MN7, having a gate for receiving the second signal BN and a source connected to the ground signal Vss. When the first signal B is at a high level and the second signal BN is at a low level, the zeroth NMOS transistor MN0 is turned on and the seventh NMOS transistor MN7 is turned off; and when the first signal B is at a low level and the second signal BN is at a high level, the zeroth NMOS transistor MN0 is turned off and the seventh NMOS transistor MN7 is turned on.

In the embodiment of the disclosure, the first logical unit 23 includes: a first PMOS transistor MP1 having a gate for receiving the fourth signal AN and a source connected to a drain of the zeroth PMOS transistor MP0; a first NMOS transistor MN1 having a gate for receiving the third signal A, a drain connected to a drain of the first PMOS transistor MP1, and a source connected to a drain of the zeroth NMOS transistor MN0; a fourth PMOS transistor MP4 having a gate for receiving the third signal A and a source connected to a drain of the seventh PMOS transistor MP7; and a fourth NMOS transistor MN4 having a gate for receiving the fourth signal AN, a drain connected to a drain of the fourth PMOS transistor MP4, and a source connected to a drain of the seventh NMOS transistor MN7.

The second logical unit 24 includes: a second PMOS transistor MP2 having a gate for receiving the third signal A and a source connected to a drain of the zeroth PMOS transistor MP0; a second NMOS transistor MN2 having a gate for receiving the fourth signal AN, a drain connected to a drain of the second PMOS transistor MP2, and a source connected to a drain of the zeroth NMOS transistor MN0; a fifth PMOS transistor MP5 having a gate for receiving the fourth signal AN and a source connected to a drain of the seventh PMOS transistor MP7; and a fifth NMOS transistor MN5 having a gate for receiving the third signal A, a drain connected to a drain of the fifth PMOS transistor MP5, and a source connected to a drain of the seventh NMOS transistor MN7.

Furthermore, a drain of the first PMOS transistor MP1 is connected to a drain of the fourth PMOS transistor MP4, to output a first operation signal Y; a drain of the second PMOS transistor MP2 is connected to a drain of the fifth PMOS transistor MP5, to output a second operation signal YN.

In the comparison circuit provided by the embodiment of the disclosure, the XOR logic and the XNOR logic share four MOS transistors. The sharing of the MOS transistors may reduce the area, and the size of the shared MOS transistor may be made larger, thereby improving the driving capability.

Referring to FIGS. 1 and 2, in the embodiment of the disclosure, the encoding module 102 is further configured to, at a decoding phase, receive multiple transmitted data, the X first check codes and the Y second check codes, perform a third encoding operation based on a subset of data in each of the bytes and the X first check codes to generate X first operation codes, and perform a fourth encoding operation based on all data in a subset of the bytes and the Y second check codes to generate Y second operation codes.

In the embodiment of the disclosure, the bits of the data participating in the operation are the same for the third encoding operation and the first encoding operation, except for that the first check code(s) also participate(s) in the third encoding operation; the bytes participating in the operation are the same for the fourth encoding operation and the second encoding operation, except for that the second check code(s) also participate(s) in the fourth encoding operation.

It should be noted that the encoding operation functions at the encoding stage and the decoding stage may be integrated into the same functional unit. In another example, the encoding operation functions at the encoding stage and the decoding stage may be implemented by using different functional units.

In general, the decoding stage occurs during data is read at the read operation. In the embodiment of the disclosure, with reference to FIG. 2 and the forgoing descriptions of the principle of generating the first check code and the second check code, it is necessary for the encoding operation at the decoding stage to perform an XOR operation on the first check code p10, p11 or p12 respectively based on the forgoing encoding operation at the encoding stage, to obtain the first operation code p20, p21 or p22 respectively. That is, the first operation code p20 is obtained by performing the third encoding operation on the received data of different bits in each of the bytes and the first check code p10 by using the formula pc0; the first operation code p21 is obtained by performing the third encoding operation on the received data of different bits in each of the bytes and the first check code p11 by using the formula pc1; the first operation code p22 is obtained by performing the third encoding operation on the received data of different bits in each of the bytes and the first check code p12 by using the formula pc2. The first operation code and the second operation code correspond to PB in FIG. 2.

Similarly, for the second check codes and the second operation codes, it is necessary for the encoding operation at the decoding stage to perform an XOR operation on the second check codes p13, p14, p15, p16 or p17 respectively based on the forgoing encoding operation at the encoding stage, to obtain the second operation code p23, p24, p25, p26 or p27 respectively.

p20, p21 and p22 constitute a third binary number, and p20 is the lowest bit and p22 is the highest bit. In the case where only one of the data in the memory is erroneous, when the third encoding operation is an XOR (which may also be XNOR in some embodiments of the disclosure), it is not difficult to find that:

When the data at the zeroth bit is erroneous, each of the first operation codes p20, p21 and p22 is zero since the zeroth bit does not participate in the formulas pc0, pc3 and pc3, and a decimal number corresponding to the third binary number 000 is zero, so that the erroneous data at the zeroth bit is detected.

When the data at the first bit is erroneous, the first operation code p20 is 1 while the first operation codes p21 and p22 are zero since the first bit participates in the formula pc0 and does not participate in the formulas pc1 and pc2, and a decimal number corresponding to the third binary number 001 is 1, so that the erroneous data at the first bit is detected.

When the data at the second bit is erroneous, the first operation code p20 is zero, the first operation code p21 is 1 while the first operation code p22 is zero since the second bit participates in the formula pc1, and a decimal number corresponding to the third binary number 010 is 2, so that the erroneous data at the second bit is detected.

When the data at the third bit is erroneous, each of the first operation codes p20 and p21 is 1 while the first operation code p22 is zero since the third bit participates in the formulas pc0 and pc1, and a decimal number corresponding to the third binary number 011 is 3, so that the erroneous data at the third bit is detected.

By analogy, when the data at the seventh bit is erroneous, each of the first operation codes p20, p21 and p22 is 1 since the seventh bit participates in the formulas pc0, pc1 and pc2, and a decimal number corresponding to the third binary number 111 is seven, so that the erroneous data at the seventh bit is detected.

In the embodiment of the disclosure, the memory system may further include a decoding module 103 configured to receive the X first operation codes and the Y second operation codes, and to locate erroneous data. In the embodiment of the disclosure, the X first operation codes are used to locate the bit where the error occurs, and the Y second operation codes are used to locate the byte where the error occurs. For specific principles and descriptions of the first operation code and the second operation code locating erroneous data, it may refer to the foregoing descriptions of the first check codes and the second check codes, and will not be elaborated here.

It should be noted that the decoding module 103 may be integrated together with the memory 101 in the same memory chip; in an embodiment, the memory system further includes a controller configured to control the memory, and the decoding module is inherited within the controller. Furthermore, it should be noted that the decoding module 103 and the encoding module 102 may also be integrated into the same functional module.

Figure 8:
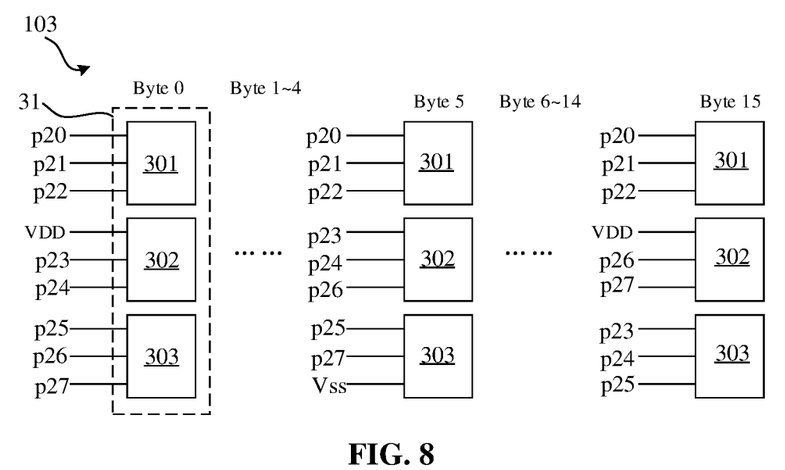
FIG. 8 is a schematic structural diagram of a decoding module in a memory system according to an embodiment of the disclosure.

FIG. 8 is a schematic structural diagram of a decoding module in a memory system according to an embodiment of the disclosure. Referring to FIG. 8, the decoding module 103 includes M decoding units 31, each corresponding to a respective one of the bytes, and configured to perform decoding on the X first operation codes and the Y second operation codes to determine whether the respective byte has erroneous data and to locate one or more bits of the erroneous data. In FIG. 8, the first operation codes are marked by p20, p21 and p22, and the second operation codes are marked by p23, p24, p25, p26 and p27. In the embodiment of the disclosure, each of the decoding units 31 performs decoding on the X first operation codes and the Y second operation codes corresponding to the byte.

That is, the number of decoding units 31 is the same as the number of bytes.

Figure 9:
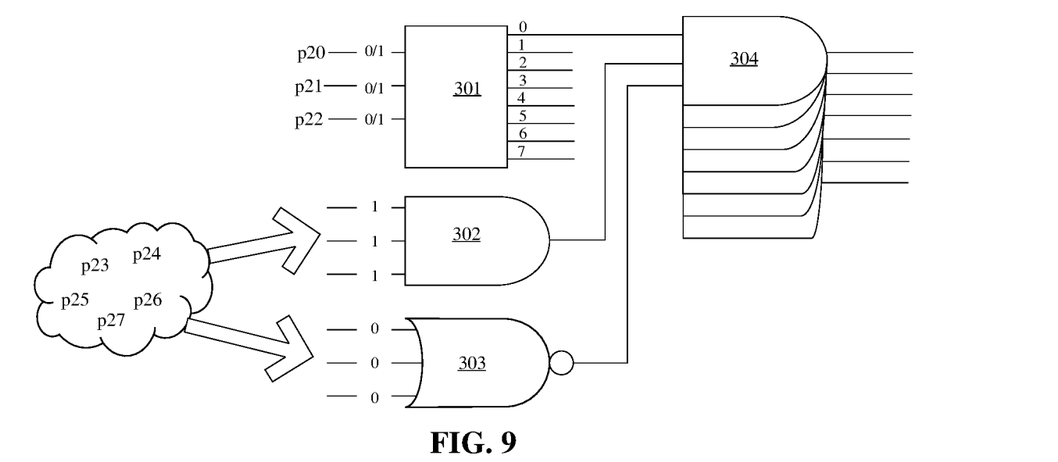
FIG. 9 is an enlarged schematic structural diagram of a decoding unit corresponding to byte 5 in a decoding module according to an embodiment of the disclosure.

FIG. 9 is an enlarged schematic structural diagram of a decoding unit corresponding to byte 5 in a decoding module according to an embodiment of the disclosure.

Referring to FIG. 9, in the embodiment of the disclosure, the decoding unit 31 includes: a decoder 301 configured to receive the X first operation codes and output N first decoded signals, each of the N first decoded signals corresponding to a respective one bit of the N data; a first AND gate unit 302 configured to receive at least two selected operation codes and perform a logical AND operation, the selected operation codes being the second operation codes obtained by performing the fourth encoding operation on a subset of the Y second check codes corresponding to the respective byte; an NOR gate unit 303 configured to receive at least two unselected operation codes and perform a logical NOR operation, the unselected operation codes being the second operation codes other than the selected operation codes of the Y second check codes; and N second AND gate units 304, each having an input terminal connected to an output terminal of the first AND gate unit 302, an output terminal of the NOR gate unit 303 and one of the first decoded signals, here a position of erroneous data is acquired based on outputs of the N second AND gate units 304. It should be noted that the second check codes corresponding to the respective byte herein means that the byte is selected to participate in the second check codes formed by the second encoding operation. For example, as may be seen in FIG. 2, the second check codes corresponding to the zeroth byte are p13 and p14.

It should be noted that FIG. 9 merely illustrates a connection relationship between a first decoded signal and a second AND gate unit 304.

In the embodiment of the disclosure, the decoder 301 is a three-eight decoder having three input terminals for receiving three first operation codes, eight output terminals for outputting eight first decoded signals, each characterizing a condition of data at a respective one of eight bits in the same byte.

In the embodiment of the disclosure, each of the first operation codes p20, p21 and p22 is zero or one, and the output terminals are marked by zero to seven. When an error occurs at the zeroth bit, and the zeroth bit does not participate in the encoding operation of the first operation code, then each of p20, p21 and p22 is zero, and accordingly, the "zero" output terminal is one, and each of the remaining output terminals is zero. When an error occurs at the first bit, p20 is one and each of p21 and p22 is zero, and accordingly, the "one" output terminal is one, and each of the remaining output terminals is zero. By analogy, when an error occurs at the seventh bit, each of p20, p21 and p22 is one, and accordingly, the "seven" output terminal is one, and each of the remaining output terminals is zero.

It should be noted that in some embodiments of the disclosure, the number of the input terminals and the number of the output terminals of the decoder may be reasonably set according to the first check codes and the number of bits in each of the bytes.

The first AND gate unit 302 has a characteristic that the output terminal is one when each of the input terminals is one, and the output terminal is zero when one or more of the input terminals are zero. In the embodiment of the disclosure, the first AND gate unit 302 has three input terminals, and is further configured to connect one of the input terminals of the first AND gate unit 302 to a power supply $V_{DD}$ when a number of the selected operation codes is 2.

The NOR gate unit 303 has a characteristic that the output terminal is one when each of the input terminals is zero, and the output terminal is zero when one or more of the input terminals are one. In the embodiment of the disclosure, the NOR gate unit 303 has three input terminals, and is further configured to connect one of the input terminals of the NOR gate unit 303 to the ground Vss when a number of the unselected operation codes is 2.

In the embodiment of the disclosure, the selected operation code corresponds to a second operation code obtained after performing the fourth encoding operation on the second check codes corresponding to the byte; and the unselected operation code corresponds to a second operation code obtained after performing the fourth encoding operation on the remaining second check codes other than the second check codes corresponding to the byte.

For example, for byte 0, the second operation codes p23 and p24 are second operation codes obtained by performing the fourth encoding operation on the second check codes p13 and p14 corresponding to byte 0, and the second operation codes p23 and p24 are input to the input terminals of the first AND gate unit 302, and the remaining second operation codes p25, p26 and p27 are input to the input terminals of the NOR gate unit 303. For byte 1, the second operation codes p24 and p25 are second operation codes obtained by performing the fourth encoding operation on the second check codes p14 and p15 corresponding to byte 1, and the second operation codes p24 and p25 are input to the input terminals of the first AND gate unit 302, and the remaining second operation codes p23, p26 and p27 are input to the input terminals of the NOR gate unit 303. For byte 4, the second operation codes p23, p24 and p25 are input to the input terminals of the first AND gate unit 302, and the remaining second operation codes p26 and p27 are input to the input terminals of the NOR gate unit 303. Operations for other bytes will not be enumerated one by one.

The number of the second AND gate units 304 is the same as the number of bits in the same byte. In the embodiment of the disclosure, N is eight, and accordingly, there are eight second AND gate units 304, and it is determined whether the byte has erroneous data and in which bit the error occurs according to the output of the eight second AND gate units 304.

It is not difficult to find that in the embodiment of the disclosure, the circuit of the decoding unit 31 is the same for each of the bytes except that the wiring of the input terminals is different, and the wiring of the input terminals of the first AND gate unit 302 and the NOR gate unit 303 corresponding to each of the bytes is determined by the five formulas pc3 to pc7 in FIG. 2. The second operation codes obtained by performing the fourth encoding operation on the second check codes corresponding to each of the bytes, are connected to the input terminals of the first AND gate unit 302, and the second operation codes obtained by performing the fourth encoding operation on the remaining second operation codes other than the second check codes corresponding to each of the bytes, are connected to the input terminals of the NOR gate unit 303. Furthermore, unused input terminals of the first AND gate unit 302 are connected to the power supply, unused input terminals of the NOR gate unit 303 is grounded, and the first operation code is connected to an input terminal of the decoder 301. Therefore, the decoding unit 301 uses only eight wires to connect the input terminals, and each of the wires transmits one of the first operation codes or one of the second operation codes, thereby saving the wires and area, while facilitating to increase the decoding speed.

In order to facilitate understanding of the decoding circuit, a decoding unit corresponding to byte 5 is used as an example, and the decoding circuit will be described in more detail below with reference to the operating principle of the decoding circuit.

When each of the outputs of the eight second AND gate units 304 is zero, it means that none of the data in the byte are erroneous.

When one of the outputs of the eight second AND gate units 304 is one, it means that data of one bit in the byte is erroneous. In the embodiment of the disclosure, data of the byte is erroneous, each of the second operation codes p23, p24 and p26 is one and the output of the first AND gate unit 302 is one, each of the unselected operation codes p25 and p27 is zero and the output of the NOR gate unit 303 is one. At this time, when the output of one of the N second AND gate unit 304, corresponding to a first decoded signal, is one, then it can be determined that data at the bit corresponding to the first decoded signal is erroneous.

It may be understood that in the embodiment of the disclosure, it is taken as an example that when the first decoded signal is 1, data at the corresponding bit is erroneous, and when the first decoded signal is 0, data at the corresponding bit is not erroneous. In some embodiments of the disclosure, it may be designed that when the first decoded signal is 0, data at the corresponding bit is erroneous, and when the first decoded signal is 1, data at the corresponding bit is not erroneous. Accordingly, those skilled in the art may design other conditions according to requirements, for example, the first decoded signal is connected to an NOR gate circuit for output, etc.

It should be noted that when all data in the M bytes are not erroneous and only one of the X first check codes is erroneous, one of the first operation codes is one, and then one of the outputs of the decoder 301 is one. However, since the Y second check codes are not erroneous, each of the second operation codes is zero, and then the output of the first AND gate unit 302 and the output of the second AND gate unit 304 are zero, which means that none of data in the M bytes are erroneous. When none of the data in the M bytes are erroneous and only one of the Y second check codes is erroneous, the first operation code is zero, and then the "zero" output terminal of the decoder 301 is one. However, since none of the remaining Y−1 second check codes is erroneous, each of Y−1 second operation codes corresponding thereto is zero, the output of the first AND gate unit 302 is zero, and then the output of the second AND gate unit 304 is zero, which means that none of the data in the M bytes are erroneous.

It may be understood that in the embodiment of the disclosure, the first operation code is generated based on the first check code(s), and the erroneous data in the byte is located by using the first operation code generated based on the first check code(s). Therefore, the first check code(s) is/are configured for at least one of error detection or error correction on the N data in each of the bytes. A second operation code is generated based on the second check code(s), and the erroneous byte is located by using the second operation code generated based on the second check code(s). Therefore, the second check code(s) is/are configured for at least one of error detection or error correction on the M bytes.

Embodiments of the disclosure provide a memory system having excellent structural performance. The special design of the encoding module 102 may implement ECC, may detect and correct one-bit error, and may also reduce hardware circuits, thereby reducing power consumption of the memory system and improving encoding speed and decoding speed. Furthermore, the special design of the first check code(s) and the second check code(s) allows the difference in encoding time for all data combinations to be small, and the difference in decoding time for all data combinations to be small, thereby reducing the requirement on the control circuit.

It may be understood by those of ordinary skill in the art that the embodiments as described above are specific embodiments of the disclosure, and that various changes may be made to the form and detail thereof in practical applications without departing from the spirit and scope of the disclosure. Any of those skilled in the art may make their own changes and modifications without departing from the spirit and scope of the disclosure, therefore the scope of protection of the disclosure shall be subject to the scope defined by the claims.

Embodiments of the disclosure provides a memory system including: a memory, configured to, during a read or write operation, write or read multiple data, here the multiple data are divided into M bytes, each having N data; and an encoding module, configured to generate, at an encoding stage, X first check codes, each based on a subset of the data at fixed bits among all the bytes, and to generate, at the encoding stage, Y second check codes based on all data in a subset of the bytes, here the X first check codes are configured for at least one of error detection or error correction on the N data in each of the bytes, and the Y second check codes are configured for at least one of error detection or error correction on the M bytes; here each of M, N, X and Y is a positive natural number.

In the memory system provided by the embodiment of the disclosure, the encoding module is configured to: generate X first check codes based on a subset of data in a byte, and a subset of data of different bytes have the same bit in the different bytes, and the erroneous bit may be located by the X first check codes; and to generate Y second check codes based on all data of a subset of bytes, the erroneous byte may be located by the Y second check codes; the erroneous data may be located to a specific byte and a specific bit in the byte, to achieve the purpose of error detection and/or error correction. In the embodiment of the disclosure, by designing a special encoding module implemented by encoding, fewer hardware circuits may be used to implement the ECC technology, thereby reducing power consumption while increasing the encoding speed, and facilitating reduction of the encoding difficulty.

The invention claimed is:

1. A memory system comprising:
a memory, configured to, during a read or write operation, write or read a plurality of data, wherein the plurality of data are divided into M bytes, each having N data; and
an encoding circuit, configured to generate, at an encoding stage, X first check codes, each based on a subset of the data at fixed bits among all the bytes, and to generate, at the encoding stage, Y second check codes based on all data in a subset of the bytes, wherein the X first check codes are configured for at least one of error detection or error correction on the N data in each of the bytes, and the Y second check codes are configured for at least one of error detection or error correction on the M bytes;
wherein each of M, N, X and Y is a positive natural number.

2. The memory system of claim 1, wherein the encoding circuit comprises a first encoding circuit configured to generate the X first check codes, and the X first check codes constitute an X-bit first binary number; wherein 2X is greater than or equal to N, each of the first check codes is obtained by performing a first encoding operation on the subset of the data in all the bytes, and the X first check codes correspond to X subsets of the data in a one-to-one manner, different subsets corresponding to different bit combinations in the bytes.

3. The memory system of claim 2, wherein the N data have bits from zero to N−1, which are incremental by a natural number, and the first check codes obtained by selecting each of the bits to perform the first encoding operation are not exactly the same as those obtained by selecting another of the bits.

4. The memory system of claim 2, wherein N is 8 and X is 3; the first encoding operation comprises a not exclusive OR (XNOR) operation or an exclusive OR (XOR) operation, the first encoding circuit is configured such that in the X-bit first binary number, the first check code at a lowest bit is XOR or XNOR of data at first, third, fifth and seventh bits of all the bytes, the first check code at a highest bit is XOR or XNOR of data at fourth, fifth, sixth and seventh bits of all the bytes, and the first check code at an intermediate bit is XOR or XNOR of data at second, third, sixth and seventh bits of all the bytes.

5. The memory system of claim 2, wherein the encoding circuit further comprises a second encoding circuit, configured to generate the Y second check codes, and the Y second check codes constitute a Y-bit second binary number; wherein 2Y is greater than or equal to M, and each of the second check codes is obtained by performing a second encoding operation on a second subset of the bytes.

6. The memory system of claim 5, wherein the second encoding operation comprises a not exclusive OR (XNOR) operation or an exclusive OR (XOR) operation; the second encoding circuit comprises:
a first-stage operation circuit, configured to perform the XOR or XNOR operation on all data of selected two of the bytes, and store a plurality of first operation results, each being an XOR or XNOR operation result of the selected two of the bytes; and
a second-stage operation circuit, configured to perform the XOR or XNOR operation on at least two of the plurality of first operation results, to generate the second check code, and generate the Y second check codes based on different encoding requirements.

7. The memory system of claim 6, wherein the first-stage operation circuit comprises:
a first operation sub-circuit, configured to perform an XOR or XNOR operation on all data of a same one of the bytes and store second operation results; and
a second operation sub-circuit, configured to perform an XOR or XNOR operation on two of the second operation results and acquire one of the plurality of first operation results.

8. The memory system of claim 5, wherein the second encoding circuit is configured such that a number of times that each of the bytes participates in the second encoding operation is a, wherein a is a positive integer greater than or equal to (Y−1)/2 and less than or equal to (Y+1)/2.

9. The memory system of claim 8, wherein M is 16 and Y is 5; the M bytes are divided into zeroth to fifteenth bytes in natural number increments; the Y second check codes are divided into third to seventh second check codes in natural number increments;
the third second check code is an exclusive OR (XOR) or a not exclusive OR (XNOR) on all data of the zeroth, second, third, fourth, fifth, sixth and eighth bytes;

the fourth second check code is XOR or XNOR on all data of the zeroth, first, fourth, fifth, seventh, ninth, tenth and twelfth bytes;

the fifth second check code is XOR or XNOR on all data of the first, second, fourth, sixth, ninth, eleventh, thirteenth and fourteenth bytes;

the sixth second check code is XOR or XNOR on all data of the third, fifth, sixth, seventh, tenth, eleventh, fourteenth and fifteenth bytes;

the seventh second check code is XOR or XNOR on all data of the eighth, ninth, tenth, eleventh, twelfth, thirteenth and fifteenth bytes.

10. The memory system of claim 2, wherein the encoding circuit comprises a comparison circuit, configured to perform an exclusive OR (XOR) operation or a not exclusive OR (XNOR) operation on all data of any two of the bytes, or perform the XOR or XNOR operation on the subset of the data.

11. The memory system of claim 10, wherein the comparison circuit comprises:
a first common circuit, connected to a power supply signal and configured to control output of the power supply signal based on a first signal and a second signal which are inverted;
a second common circuit, connected to a ground signal and configured to control output of the ground signal based on the first signal and the second signal;
a first logical circuit, connected between the first common circuit and the second common circuit, and configured to receive a third signal and a fourth signal which are inverted, and output a first operation signal which is an XOR of the first signal and the third signal; and
a second logical circuit, connected between the first common circuit and the second common circuit, and configured to receive the third signal and the fourth signal, and output a second operation signal which is an XNOR of the first signal and the third signal.

12. The memory system of claim 11, wherein the first common circuit comprises:
a zeroth P-channel Metal Oxide Semiconductor (PMOS) transistor, having a gate for receiving the first signal and a source connected to the power supply signal; and
a seventh PMOS transistor, having a gate for receiving the second signal and a source connected to the power supply signal; and
wherein the second common circuit comprises:
a zeroth N-channel Metal Oxide Semiconductor (NMOS) transistor, having a gate for receiving the first signal and a source connected to the ground signal; and
a seventh NMOS transistor, having a gate for receiving the second signal and a source connected to the ground signal.

13. The memory system of claim 12, wherein the first logical circuit comprises:
a first PMOS transistor, having a gate for receiving the fourth signal and a source connected to a drain of the zeroth PMOS transistor;
a first NMOS transistor, having a gate for receiving the third signal, a drain connected to a drain of the first PMOS transistor, and a source connected to a drain of the zeroth NMOS transistor;
a fourth PMOS transistor, having a gate for receiving the third signal and a source connected to a drain of the seventh PMOS transistor; and
a fourth NMOS transistor, having a gate for receiving the fourth signal, a drain connected to a drain of the fourth PMOS transistor, and a source connected to a drain of the seventh NMOS transistor.

14. The memory system of claim 12, wherein the second logical circuit comprises:
a second PMOS transistor, having a gate for receiving the third signal and a source connected to a drain of the zeroth PMOS transistor;
a second NMOS transistor, having a gate for receiving the fourth signal, a drain connected to a drain of the second PMOS transistor, and a source connected to a drain of the zeroth NMOS transistor;
a fifth PMOS transistor, having a gate for receiving the fourth signal and a source connected to a drain of the seventh PMOS transistor; and
a fifth NMOS transistor, having a gate for receiving the third signal, a drain connected to a drain of the fifth PMOS transistor, and a source connected to a drain of the seventh NMOS transistor.

15. The memory system of claim 1, wherein the encoding circuit is further configured to, at a decoding phase, receive a plurality of transmitted data, the X first check codes and the Y second check codes, perform a third encoding operation based on a subset of data in each of the bytes and the X first check codes to generate X first operation codes, and perform a fourth encoding operation based on all data in a second subset of the bytes and the Y second check codes to generate Y second operation codes.

16. The memory system of claim 15, further comprising a decoding circuit configured to receive the X first operation codes and the Y second operation codes, and to locate erroneous data.

17. The memory system of claim 16, wherein the decoding circuit comprises M decoding sub-circuits, each corresponding to a respective one of the bytes, and configured to perform decoding on the X first operation codes and the Y second operation codes to determine whether the respective byte has erroneous data and to locate one or more bits of the erroneous data.

18. The memory system of claim 17, wherein each of the decoding sub-circuits comprises:
a decoder, configured to receive the X first operation codes and output N first decoded signals, each of the N first decoded signals corresponding to a respective one bit of the N data;
a first AND gate circuit, configured to receive at least two selected operation codes and perform a logical AND operation, the at least two selected operation codes being the second operation codes obtained by performing the fourth encoding operation on a subset of the Y second check codes corresponding to the respective byte;
an NOR gate circuit, configured to receive at least two unselected operation codes and perform a logical NOR operation, the at least two unselected operation codes being the second operation codes other than the selected operation codes corresponding to the respective byte; and
N second AND gate circuits, each having an input terminal connected to an output terminal of the first AND gate circuit, an output terminal of the NOR gate circuit and one of the first decoded signals, wherein a position of erroneous data is acquired based on outputs of the N second AND gate circuits.

19. The memory system of claim 18, wherein the first AND gate circuit has three input terminals, and is further configured to connect one of the input terminals of the first AND gate circuit to a power supply when a number of the selected operation codes is 2, or wherein the NOR gate circuit has three input terminals, and is further configured to ground one of the input terminals of the NOR gate circuit when a number of the unselected operation codes is 2.

20. The memory system of claim 1, wherein the memory system comprises a memory chip.

* * * * *